United States Patent
Wang et al.

(10) Patent No.: US 10,593,866 B2
(45) Date of Patent: Mar. 17, 2020

(54) MAGNETIC FIELD ASSISTED MRAM STRUCTURES, INTEGRATED CIRCUITS, AND METHODS FOR FABRICATING THE SAME

(71) Applicant: Globalfoundries Singapore Pte. Ltd., Singapore (SG)

(72) Inventors: Chenchen Jacob Wang, Singapore (SG); Michael Nicolas Albert Tran, Singapore (SG); Dimitri Houssameddine, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/020,419

(22) Filed: Jun. 27, 2018

(65) Prior Publication Data
US 2020/0006624 A1   Jan. 2, 2020

(51) Int. Cl.
*H01L 43/02* (2006.01)
*H01L 43/10* (2006.01)
*G11C 11/16* (2006.01)
*H01L 27/22* (2006.01)
*H01L 43/12* (2006.01)

(52) U.S. Cl.
CPC ............ *H01L 43/02* (2013.01); *G11C 11/161* (2013.01); *H01L 27/226* (2013.01); *H01L 43/10* (2013.01); *H01L 43/12* (2013.01)

(58) Field of Classification Search
CPC ......... H01L 43/02; H01L 43/10; H01L 43/12; H01L 27/226; G11C 11/161
See application file for complete search history.

(56) References Cited

U.S. PATENT DOCUMENTS

| | | | |
|---|---|---|---|
| 7,061,731 B2 | 6/2006 | Larson et al. | |
| 2007/0097736 A1* | 5/2007 | Inokuchi | G11C 11/16 365/158 |
| 2009/0237987 A1* | 9/2009 | Zhu | G11C 11/15 365/171 |
| 2012/0250405 A1* | 10/2012 | Wang | G11C 11/1675 365/171 |
| 2014/0153324 A1* | 6/2014 | Yu | H01L 43/08 365/158 |
| 2016/0260466 A1* | 9/2016 | Katayama | G11C 11/161 |
| 2016/0268499 A1* | 9/2016 | You | H01L 43/12 |
| 2016/0358973 A1* | 12/2016 | Katine | G11C 11/1675 |

OTHER PUBLICATIONS

Jeong, et al., "Highly scalable MRAM using field assisted current induced switching", Symposium on VLSI Technology Digest of Technical Papers, 2005, pp. 184-185.
Patel et al., "Reducing Switching Latency and Energy in STT-MRAM Caches With Field-assisted Writing", IEEE Transactions on Very Large Scale Integration (VLSI) Systems, 2015, pp. 1-10.

* cited by examiner

*Primary Examiner* — Yosef Gebreyesus
(74) *Attorney, Agent, or Firm* — Thompson Hine LLP

(57) ABSTRACT

Magnetic field assisted magnetoresistive random access memory (MRAM) structures, integrated circuits including MRAM structures, and methods for fabricating integrated circuits including MRAM structures are provided. An exemplary integrated circuit includes a magnetoresistive random access memory (MRAM) structure and a magnetic field assist structure to generate a selected net magnetic field on the MRAM structure.

15 Claims, 6 Drawing Sheets

MAGNETIC FIELD ASSISTED MRAM STRUCTURES, INTEGRATED CIRCUITS, AND METHODS FOR FABRICATING THE SAME

TECHNICAL FIELD

The technical field generally relates to integrated circuits, and more particularly relates to integrated circuits with magnetoresistive random access memory (MRAM) structures.

BACKGROUND

A magnetic memory cell or device, such as a magnetoresistive random access memory (MRAM) device stores information by changing electrical resistance of a magnetic tunnel junction (MTJ) element. The MTJ element typically includes a thin insulating tunnel barrier layer sandwiched between a magnetically fixed layer and a magnetically free layer, forming a magnetic tunnel junction. The MTJ element could be formed of either a bottom pinned MTJ element or a top pinned MTJ element. The bottom pinned MTJ element is formed by having the magnetically fixed layer disposed below the magnetically free layer while the top pinned MTJ element is formed by having the fixed layer disposed above the free layer.

Spin transfer torque (STT) or spin transfer switching, uses spin-aligned ("polarized") electrons to directly apply a torque on the MTJ layers. Specifically, when electrons flowing into a layer have to change spin direction, a torque is developed and is transferred to the nearby layer. Data is written by altering the magnetic field direction of a magnetically free layer in the MTJ element. This affects the resistance of the structure, thereby storing the written data.

MRAM devices contain elements, or cells, that switch the MRAM device between a first state and a second state. With current methods for switching an MRAM device from a first state to a second state, write failure occurs due to several possible mechanisms, including distributions of write currents in an ensemble of bits or nondeterministic switching due to the specific nature of the write method used. In the former case, writing may be mostly successful but once in a while a write error will occur. The latter case, which is typically referred to as probabilistic switching, makes writing strongly dependent on certain parameters, such as the width of the write voltage/current pulse. While write errors can be mitigated by adding error correction code (ECC), this method adds complexity and cost to the building of memory chips. The use of ECC requires the final state be measured and the write procedure repeated if the device is not in the desired state. This method significantly degrades memory latency because it is time consuming and is not optimal as there is still a non-zero probability for the device to end up in the wrong state even after a large number of tries.

In order to achieve a low bit error rate (BER) for switching processes, faster switching performance, and greater barrier reliability, efforts have been made to reduce the MRAM switching voltage. Typically, these efforts have focused on fabricating the most robust MTJ material stack. However, low BER, faster switching performance and greater barrier reliability are among many factors considered during MTJ material stack development. For example, thermal stability, on/off ratio, and switching symmetry are also affected when the MTJ material stack is tuned for reduced voltage switching. These conflicting considerations make the optimization of the MTJ material stack difficult.

In view of the foregoing, it is desirable to provide an MRAM structure with a low bit error rate (BER) for switching processes, faster switching performance, and greater barrier reliability without interfering in the MTJ material stack design. Furthermore, it is also desirable to provide integrated circuits with magnetic field assisted MRAM structures. Also, it is desirable to provide methods for fabricating such integrated circuits that are cost effective and compatible with logic processing. Furthermore, other desirable features and characteristics will become apparent from the subsequent detailed description and the appended claims, taken in conjunction with the accompanying drawings and this background.

BRIEF SUMMARY

Magnetic field assisted magnetoresistive random access memory (MRAM) structures, integrated circuits including MRAM structures, and methods for fabricating integrated circuits including MRAM structures are provided. An exemplary integrated circuit includes a magnetoresistive random access memory (MRAM) structure and a magnetic field assist structure to generate a selected net magnetic field on the MRAM structure.

In another exemplary embodiment, a magnetic field assisted MRAM structure is provided. The magnetic field assisted MRAM structure includes a magnetic tunnel junction (MTJ) stack having a first stack sidewall and an opposite second stack sidewall and including a magnetic pinned layer, a magnetic free layer, and a barrier layer disposed between the magnetic pinned layer and the magnetic free layer. Further, the magnetic field assisted MRAM structure includes a magnetic field assist structure to generate a selected net magnetic field on the magnetic free layer.

In yet another exemplary embodiment, a method for fabricating an integrated circuit is provided. The method includes forming a magnetoresistive random access memory (MRAM) structure. Further, the method includes forming a magnetic field assist structure to generate a selected net magnetic field on the MRAM structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein:

FIG. 1 illustrates formation of an MTJ structure in accordance with an embodiment herein;

FIG. 2 illustrates formation of a magnetic field assist layer over the MTJ structure of FIG. 1 in accordance with an embodiment herein;

FIGS. 3-4 illustrate processing of the magnetic field assist layer over the MTJ structure of FIG. 1 in accordance with another embodiment herein;

FIGS. 5-6 illustrate formation of a conductive layer over the MTJ structure of FIG. 1 in accordance with an embodiment herein;

DETAILED DESCRIPTION

Figure 1:
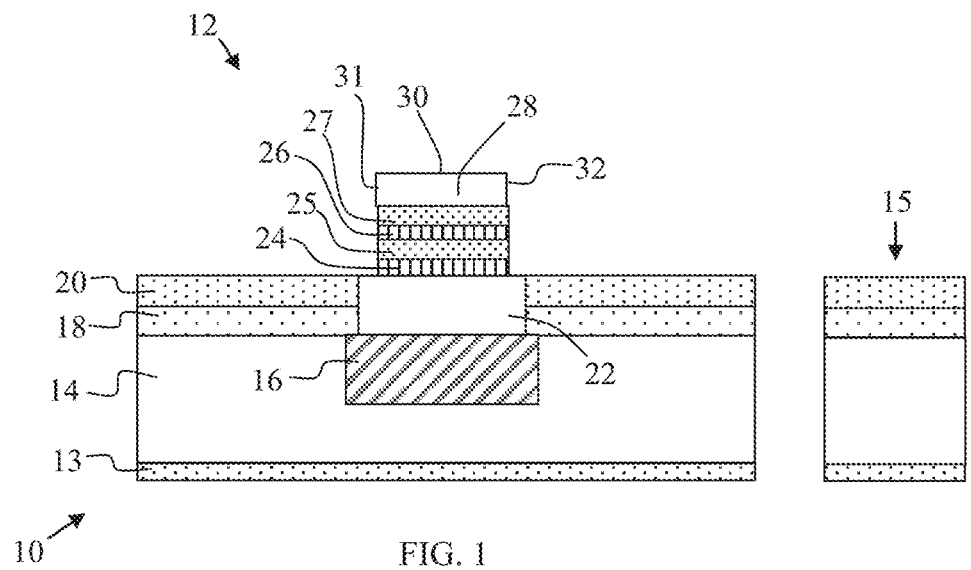
FIGS. 1-6 illustrate cross sectional views of a portion of an integrated circuit with a magnetic field assisted MRAM structure according to various embodiments herein.

The following detailed description is merely exemplary in nature and is not intended to limit the integrated circuits with magnetoresistive random access memory structures or methods for fabricating integrated circuits with magnetoresistive random access memory structures. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As used herein, it will be understood that when a first element or layer is referred to as being "over" or "under" a second element or layer, the first element or layer may be directly on the second element or layer, or intervening elements or layers may be present. When a first element or layer is referred to as being "on" a second element or layer, the first element or layer is directly on and in contact with the second element or layer. As used herein, a "material layer" is a layer that includes at least 25 wt. % of the identified material. For example, a copper layer is a layer that is at least 25 wt. % copper. Likewise, a "primarily material layer" includes at least 60 wt. % of the identified material. For example, a primarily copper layer is a layer that is at least 60 wt. % copper.

Embodiments of the present disclosure generally relate to magnetoresistive memory cells such as magnetoresistive random access memory (MRAM) structures. An exemplary magnetoresistive memory cell includes a magnetic tunnel junction (MTJ) storage unit in the form of a stack. The MTJ storage unit is formed over a bottom electrode or CMOS select transistor and under a top electrode. An exemplary MTJ storage unit includes a base layer including a seed layer and an optional wetting layer, a hard magnetic or pinned layer, a coupling layer, a reference or magnetically fixed layer, a tunnel barrier layer, a storage or magnetically free layer, and a capping layer.

Embodiments of the present disclosure provide the MRAM structures with a magnetic field assist structure to generate a selected net magnetic field on the MRAM structure. The net magnetic field may be beneficial in reducing the switching voltage of the MRAM structure or write pulse width, which may provide for increased switching speed and greater barrier reliability.

In a first embodiment, the magnetic field assist structure includes a layer of a permanent magnetic or ferrite material that is formed around the MTJ stack. An exemplary layer of material exhibits a unidirectional magnetic field substantially parallel to the substrate over which the MTJ stack and layer are formed. Thus, a net magnetic field is applied to the magnetically free layer of the MTJ stack in the same direction as the layer of material.

In a second embodiment, the magnetic field assist structure includes two conductive lines that are formed around the MTJ stack. The MTJ stack may be directly between the conductive lines, or may be formed at a higher or lower height, in relation to the substrate over which the MTJ stack and conductive lines are formed. When a selected electrical current or currents are applied to the conductive lines, each line creates a magnetic field. The location of the conductive lines, resistance of the conductive lines, and voltage and current may be tuned such that a selected magnetic field is applied to the magnetically free layer of the MTJ stack by each conductive line, thus resulting in a selected net magnetic field being applied to the magnetically free layer of the MTJ stack.

Figure 4:
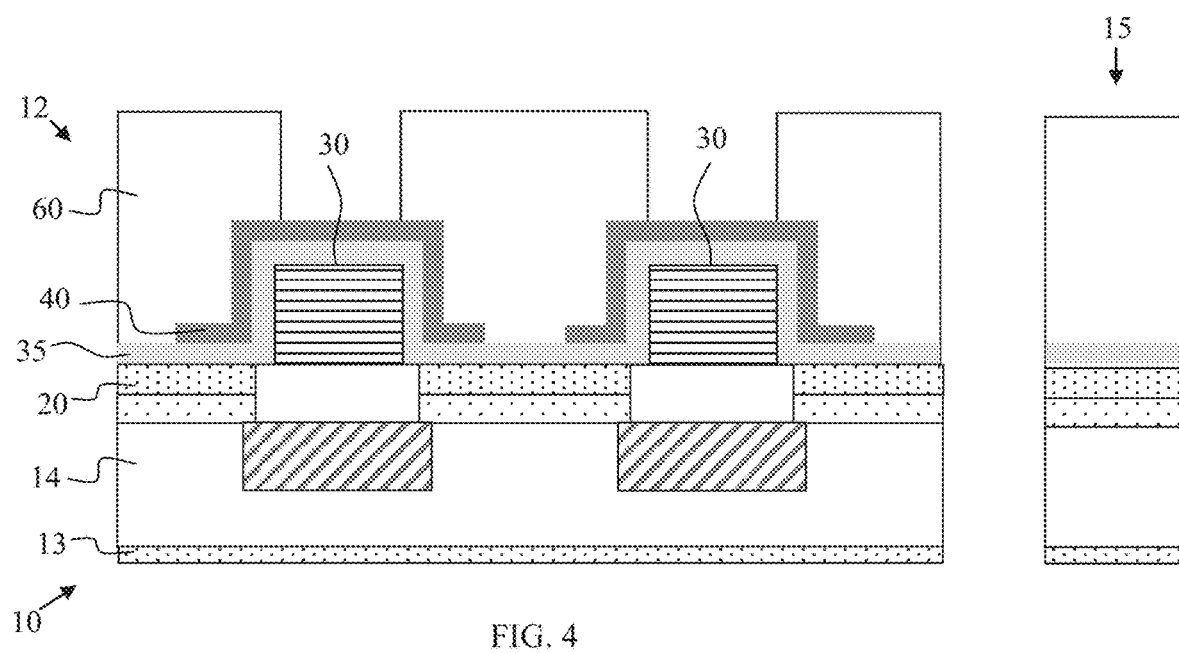
Figure 5:
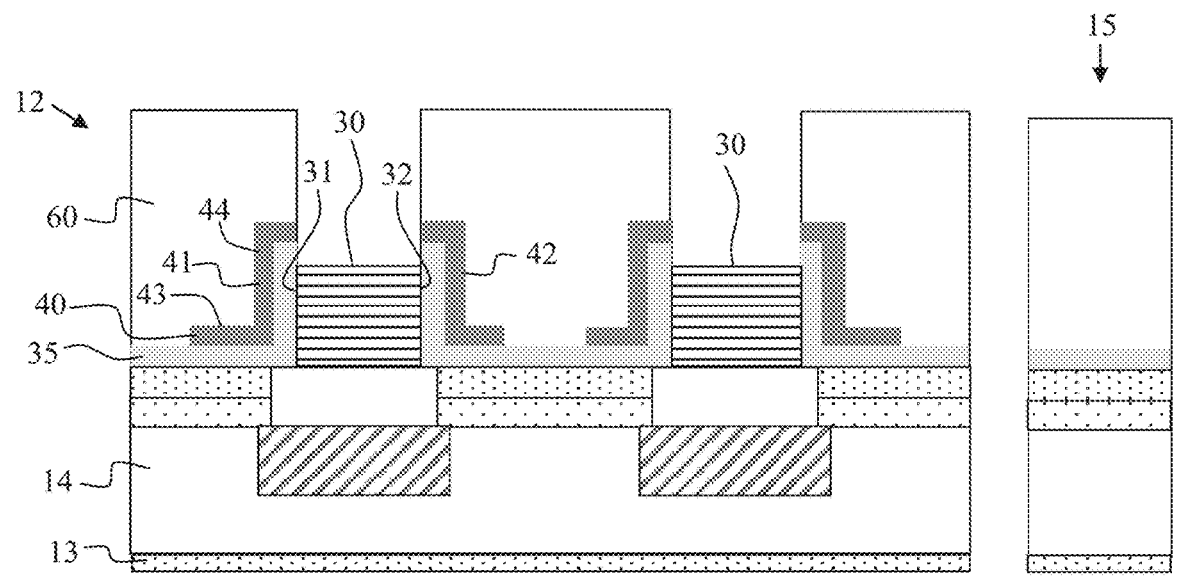
Figure 6:
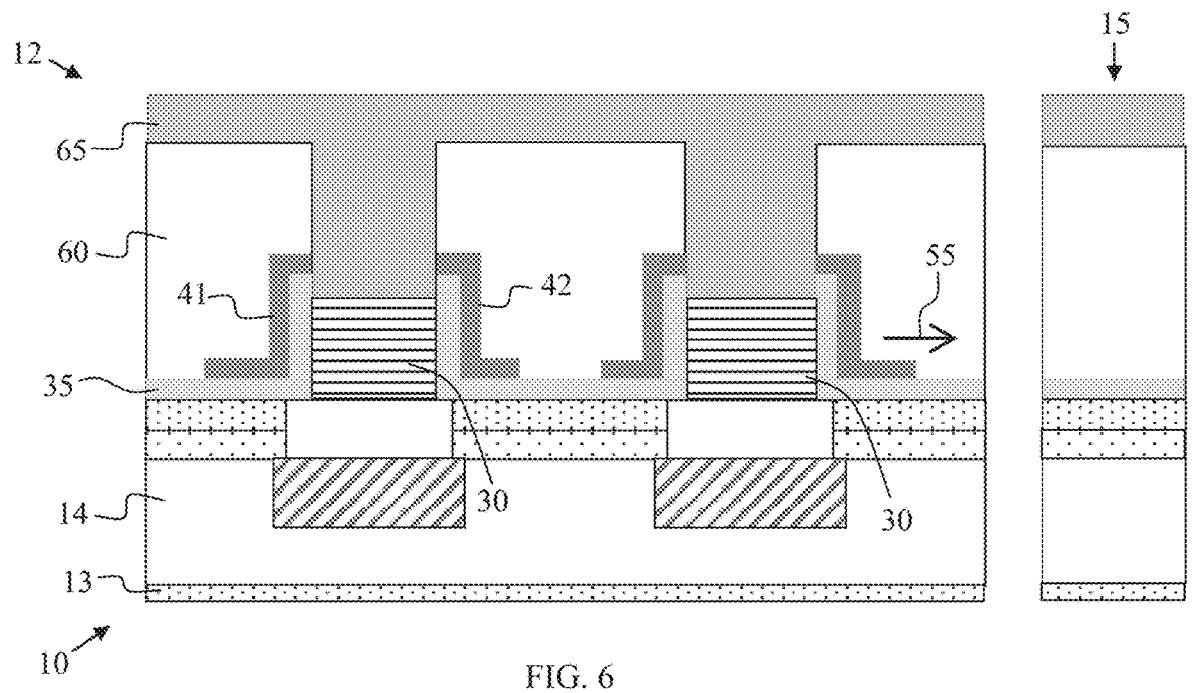

The first embodiment is described in relation to FIGS. 1-6, in which processing is described for fabricating the integrated circuit device 10 with magnetic field assisted MRAM structure 12 of FIG. 6. Each of FIGS. 1-6 illustrates a memory portion of the integrated circuit device 10, wherein a stacked MTJ structure is to be formed. The integrated circuit device 10 illustrated in FIG. 1 includes an inter-layer dielectric (ILD) layer 14 and a metallization layer 16 within the ILD layer 14. By the term "within," it is meant that a top surface of the metallization layer 16 is substantially coplanar with a top surface of the ILD layer 14, and the metallization layer 16 extends downward into the ILD layer 14, as illustrated in FIG. 1. The ILD layer 14 is considered to be formed over an underlying substrate 13, though there typically is a plurality of intervening layers and structures between the substrate 13 and the ILD layer 14, such as other ILD and/or metallization layers. The substrate 13 typically includes an active region of a semiconductor substrate forming part of the integrated circuit structure. Further, a logic region 15, contiguous and unitary with, but for simplicity illustrated separated from, the remaining portion of the substrate 13 and ILD layer 14, may include further logic circuitry fabricated over ILD layer 14.

As used herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, and the like. The substrate may further include a plurality of isolation features (not shown), such as shallow trench isolation (STI) features or local oxidation of silicon (LOCOS) features. The isolation features may define and isolate the various microelectronic elements (not shown), also referred to herein as the aforesaid active regions. Examples of the various microelectronic elements that may be formed in the substrate include transistors (e.g., metal oxide semiconductor field effect transistors (MOSFET): bipolar junction transistors (BJT); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device, radio frequency (RF) device, input/output (I/O) device, system-on-chip (SoC) device, combinations thereof, or other suitable types of devices.

The ILD layer 14 may be formed of one or more low-k dielectric materials such as, for example, un-doped silicate glass (USG), silicon nitride, silicon oxynitride, or other commonly used materials. The dielectric constants (k value) of the low-k dielectric materials may be less than about 3.9, for example, less than about 2.8. The metallization layer 16 may be formed of a metal, such as copper or copper alloys. In one particular, non-limiting embodiment, the metallization layer 16 is a fourth metallization layer (M4) or fifth metallization layer (M5). One skilled in the art will realize the formation details of the ILD layer 14 and the metallization layer 16.

As further illustrated in FIG. 1, a passivation layer 18 is formed over the top surface of the metallization layer 16 and the ILD layer 14. The passivation layer 18 may be formed of a non-organic material selected from un-doped silicate glass (USG), silicon nitride, silicon oxynitride, silicon oxide, or combinations thereof. In some alternative embodiments, the passivation layer 18 is formed of a polymer material, such as an epoxy, polyimide, benzocyclobutene (BCB), polybenzoxazole (PBO), or the like, although other relatively soft, often organic, dielectric materials may also be used.

In a specific, non-limiting embodiment, the passivation layer 18 may be formed of a silicon carbide-based passivation material including nitrogen. In one example, silicon carbide with nitrogen deposited using chemical vapor deposition (CVD) from a trimethylsilane source, which is commercially available from Applied Materials under the tradename of BLOK®, is used as the passivation layer 18. The compound with less nitrogen (N) (less than about 5 mol %), i.e., $Si_aC_bN_cH_d$, is referred to as "BLOK", and the compound with more N (about 10 mol % to about 25 mol %), i.e., $Si_wC_xN_yH_z$, is referred to as "NBLOK". BLOK has a lower dielectric constant of less than 4.0, whereas NBLOK has a dielectric constant of about 5.0. While BLOK is not a good oxygen barrier but is a good copper (Cu) barrier, NBLOK is both a good oxygen barrier and a good Cu barrier. In an exemplary embodiment, the passivation layer 18 includes NBLOK material.

In FIG. 1, a dielectric layer 20 is formed over the passivation layer 18. An exemplary dielectric layer 20 is tetraethyl orthosilicate (TEOS) or is silicon oxide, though other suitable dielectric materials may be used. In an exemplary embodiment, the dielectric layer 20 is formed by depositing a dielectric material using a chemical vapor deposition (CVD) process. Further, as shown, the passivation layer 18 and dielectric layer 20 are patterned to form an opening directly over the metallization layer 16. For example, a photoresist material layer (not shown) may be deposited over the dielectric layer 20 and patterned by exposure to a light source using known photolithographic processes. The patterning is performed so as to remove the photoresist material layer in an area directly over the metallization layer 16 and expose an upper surface of the dielectric layer 20 in the area that is directly over metallization layer 16. One or more etching steps are then performed to transfer the pattern into the dielectric layer 20 and passivation layer 18, forming a trench therein in the area that is directly over the metallization layer 16. As a result of the one or more etching steps, all or a portion of the upper surface of the metallization layer 16 is exposed. The remaining portions of the patterned photoresist layer are then removed (for example by a suitable polishing or planarization process), resulting substantially in the structure illustrated in FIG. 1, having the remaining portions (non-etched) of the upper surface of the dielectric layer 20 exposed, along with at least a portion of the upper surface of the metallization layer 16.

Further, bottom electrode layer 22 is formed on the upper surface of the metallization layer 16. An exemplary bottom electrode layer 22 is formed of a conductive material, such as a metal or a metal alloy. In an embodiment, bottom electrode layer 22 is formed of tantalum, tantalum nitride or tungsten. In an exemplary embodiment, the conductive material is deposited by chemical vapor deposition (CVD) on to the metallization layer 16.

The method may continue by forming MTJ layers 24, 25, 26 and 27 over the bottom electrode layer 22. For example, MTJ materials may be successively blanket deposited over the bottom electrode layer 22 and dielectric layer 20. In an exemplary embodiment, MTJ layer 24 may be a hard magnetic or pinning layer, MTJ layer 25 may be a fixed magnetic layer, MTJ layer 26 may be tunnel barrier layer, and MTJ layer 27 may be a free magnetic or magnetically free layer. An exemplary pinning layer 24 is formed of PtMn. An exemplary fixed magnetic layer 25 is formed of a CoFeB. An exemplary tunnel barrier layer 26 is formed of MgO. An exemplary free magnetic layer 27 is formed of CoFeB. The magnetic moment of free magnetic layer 27 may be programmed causing the resistance of the resulting MTJ structure 30 to be changed between a high resistance and a low resistance. Switching the programming of the magnetic moment of the free magnetic layer 27 is facilitated by the use of the magnetic field assist structure described below. It is realized that the MTJ structure 30 may include MTJ layers of many variations, such as including seed layers, wetting layers, anti-ferromagnetic layers that are not shown, but are also within the scope of the present disclosure.

FIG. 1 further illustrates that the MTJ structure 30 includes a top electrode layer 28. Top electrode layer 28 is formed of a conductive material, such as a metal or a metal alloy. As used herein, the term "metal" broadly refers to the following elements: Group 2 or IIA metals including beryllium (Be), magnesium (Mg), calcium (Ca), strontium (Sr), barium (Ba), and radium (Ra); Groups 3-12 including transition metals (Groups MB, IVB, VB, VIB, VIIB, VIII, IB, and IIB), including scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os). cobalt (Co), rhodium (Rh), iridium (Ir), nickel (Ni), palladium (Pd), platinum (Pt), copper (Cu), silver (Ag), gold (Au), zinc (Zn), cadmium (Cd), and mercury (Hg); Group 13 or IIIA including boron (B), aluminum (Al), gallium (Ga), indium (In), and thallium (Tl): Lanthanides including lanthanum (La), cerium (Ce), praseodymium (Pr), neodymium (Nd), promethium (Pm), samarium (Sm), europium (Eu), gadolinium (Gd), terbium (Th), dysprosium (Dy), holmium (Ho), erbium (Er), thulium (Tm), ytterbium (Yb), and lutetium (Lu); Group 14 or IVA including germanium (Ge), tin (Sn), and lead (Pb); and Group 15 or VA including antimony (Sn) and bismuth (Bi).

In an exemplary embodiment, top electrode layer 28 is formed of tantalum, tantalum nitride, titanium, and/or other commonly used conductive metals. In an exemplary embodiment, the top electrode layer 28 is formed by depositing the conductive material by a CVD process.

As shown, MTJ layers 24-27 and top electrode layer 28 are etched to form the MRAM structure 12 with an MTJ stack 30 with sidewalls 31 and 32. For example, a photoresist material layer (not shown) may be deposited and patterned over the top electrode layer 28, in the manner previously described with regard to the photoresist material layer used to etch the dielectric layer 20 and passivation layer 18, using a pattern that leaves a mask segment of photoresist material disposed over the area that is directly over the metallization layer 16. The photoresist segment serves as an etch mask for an etching process. The etching may be performed on the basis of a known technique, such as for example using reactive ion etching (RIE) and/or Ion Beam Etching (IBE). As a result of etching, all of the MTJ layers 24-27 and top electrode layer 28 are removed from over the dielectric layer 20 and from outer portions of the bottom electrode layer 22, except for an area directly underneath the photoresist material mask segment. Upon subsequent removal of the photoresist mask segment, the MTJ layers 24-27 and top electrode layer 28 form the MTJ structure as stack 30 having sidewalls 31 and 32.

Figure 2:
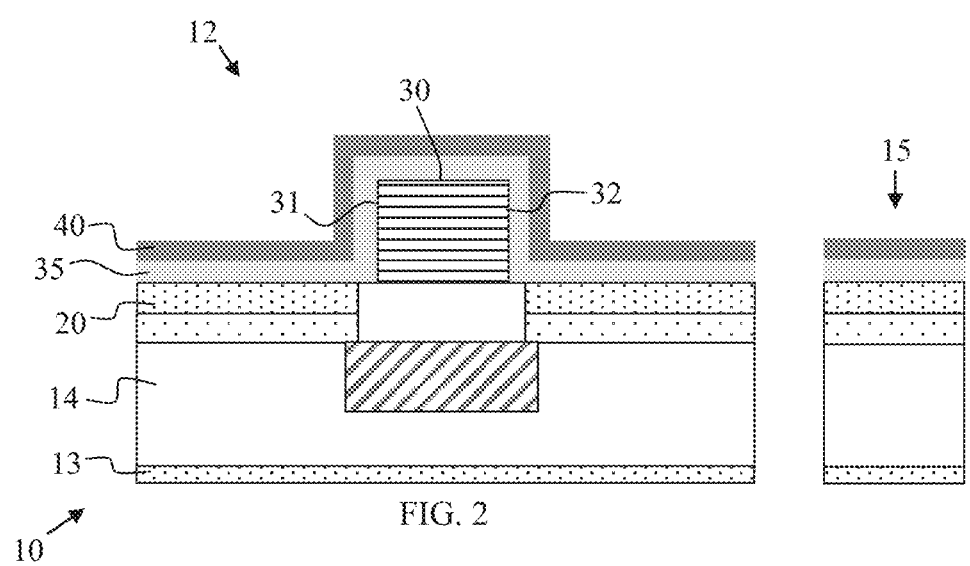

In FIGS. 2-6, the MTJ structure is generally identified by stack 30, rather than the individual layers for sake of simplicity and clarity. In FIG. 2, a spacer/capping material 35 is deposited over and around the MTJ structure 30. For example, the spacer/capping material 35 is deposited on the dielectric layer 20 and on sidewalls 31 and 32 and over the top of the MTJ stack 30. Further, the spacer/capping material 35 is deposited over the substrate 13 in the logic region 15. An exemplary spacer/capping material 35 is silicon nitride, though other suitable materials may be used. In an exemplary embodiment, the spacer/capping material 35 is deposited by low pressure chemical vapor deposition (LPCVD) or plasma-enhanced chemical vapor deposition (PECVD) processes.

Further, in FIG. 2, a magnetic field assist structure material 40, such as a permanent magnetic or ferrite material, is deposited over the spacer/capping material 35 and over and around the MTJ structure 30. An exemplary material 40 is magnetically anisotropic, and more specifically exhibits uniaxial anisotropy. In other words, the magnetic moment of exemplary material 40 will align with a single easy axis, which is an energetically favorable direction of spontaneous magnetization. In an exemplary embodiment, the material 40 is cobalt platinum (CoPt), cobalt chromium platinum (CoCrPt), cobalt chromium tantalum (CoCrTa), or cobalt chromium tantalum platinum (CoCrTaPt). An exemplary material 40 is formed as a layer with a thickness of from about 5 nm to a thickness such that the upper surface of material 40 is level with or higher than the free layer height of the MTJ stack 30, such as to about 20 nm.

In an exemplary embodiment, material 40 is deposited by a physical vapor deposition (PVD) process. During deposition, a magnetic field may be applied to induce in material 40 an in-plane uniaxial anisotropy in the desired direction.

As shown, material 40 is deposited on the spacer/capping material 35 adjacent sidewalls 31 and 32 and over the top of the MTJ stack 30. Further, material 40 is deposited over the spacer/capping material 35 overlying substrate 13 in the logic region 15.

Figure 3:
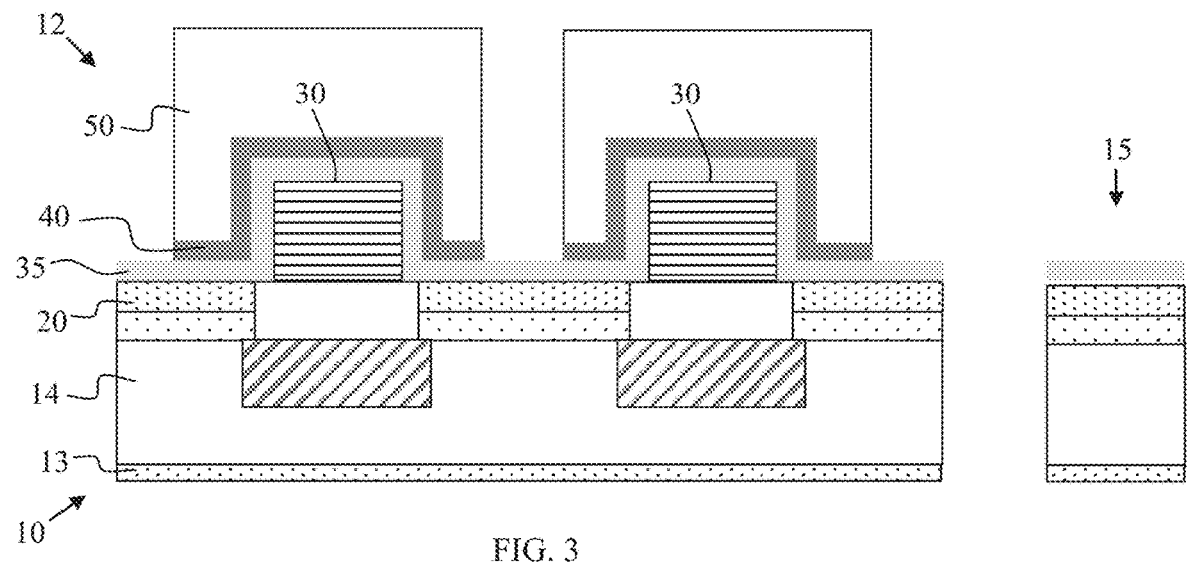

The method may continue according to an embodiment in FIGS. 3-4 for processing material 40. In FIG. 3, a photoresist material layer 50 may be deposited and patterned over material 40, in the manner previously described with regard to the photoresist material layer used to etch the dielectric layer 20 and passivation layer 18, using a pattern that leaves mask segments of photoresist material 50 disposed over the MTJ stacks 30. The photoresist segments serve as an etch mask for an etching process. The etching may be performed on the basis of a known technique, such as for example a reactive ion etch with fluorocarbon or methanol chemistry.

The spacer/capping material 35 serves as an etch stop layer for the etching process. As a result of etching, all of the material 40 is removed from the logic region 15 and from areas between adjacent MTJ stacks 30 to interrupt a conductive path otherwise formed by the material 40. Mask 50 is then removed.

In FIG. 4, a dielectric layer 60 is deposited and patterned over material 40. Dielectric layer 60 may be formed of one or more low-k dielectric materials such as, for example, un-doped silicate glass (USG), silicon nitride, silicon oxynitride, or other commonly used materials. As shown, dielectric layer 60 is etched, in the manner previously described with regard to the photoresist material layer used to etch the dielectric layer 20 and passivation layer 18, using a pattern that opens the dielectric layer 60 over the MTJ stacks 30.

Thereafter, as shown in FIG. 5, material 40 and spacer/capping material 35 exposed by dielectric layer 60 are etched. Typically, material 40 is etched first, using an appropriate chemistry such as that identified in regard to FIG. 3. Then, spacer/capping material 35 is etched, such as by a reactive ion etch, for example with tetrafluoromethane ($CF_4$).

As a result of etching, all of the material 40 and spacer/capping material 35 directly overlying the MTJ stack 30 are removed. Further, etching material 40 forms a first magnetic field assist structure segment 41 adjacent the first sidewall 31 of MTJ stack 30 and a second magnetic field assist structure segment 42 adjacent the second sidewall 32 of MTJ stack 30. Each magnetic field assist structure segment 41 and 42 includes a horizontal portion 43 overlying the ILD layer 14 over the substrate and a vertical portion 44 overlying the horizontal portion 43 and adjacent the respective stack sidewall 31 or 32.

Referring to FIG. 6, processing of the MTJ stacks 30 in the magnetic field assisted MRAM structure 12 is continued with contact formation to the top electrode 28 of each MTJ stack 30. Specifically, a conductive material 65 is deposited over the dielectric layer 60 an in contact with the MTJ stacks 30 in accordance with conventional processing. The conductive material 65, for example, may be tungsten (W). Other types of conductive materials may also be useful. The conductive material 65 may be formed by, for example, plating, such as electro or electroless plating. Other types of conductive layers or forming techniques may also be useful. A planarization process, such as CMP, may be performed to remove excess conductive material.

Cross-referencing FIGS. 1-6, it may be seen that in an exemplary embodiment, the substrate 13 defines a plane, such as a plane parallel to the surfaces of layers 14, 18, 20, and 35. Due to the uniaxial anisotropy of material 40, both the horizontal portion 43 and the vertical portion 44 of each structure segment 41 and 42 applies a magnetic field in a common direction in the plane, represented by arrow 55 in FIG. 6. The magnetic field may be applied permanently by the magnetic field assist structure 40.

Because every portion of the magnetic field assist structure segments 41 and 42 applies a magnetic field in the same direction, the magnetic field assist structure 40 generates a net magnetic field on the MRAM structure 12 having a moment direction as indicated by arrow 55. More specifically, the net magnetic field in the direction of arrow 55 is applied to the free magnetic layer 27 of the MTJ stack 30.

In order to selected a desired strength of the net magnetic field applied to the MRAM structure 12, the thickness of material 40, the length of magnetic field assist structure segments 41 and 42, and the composition of material 40 can be tuned.

Figure 7:
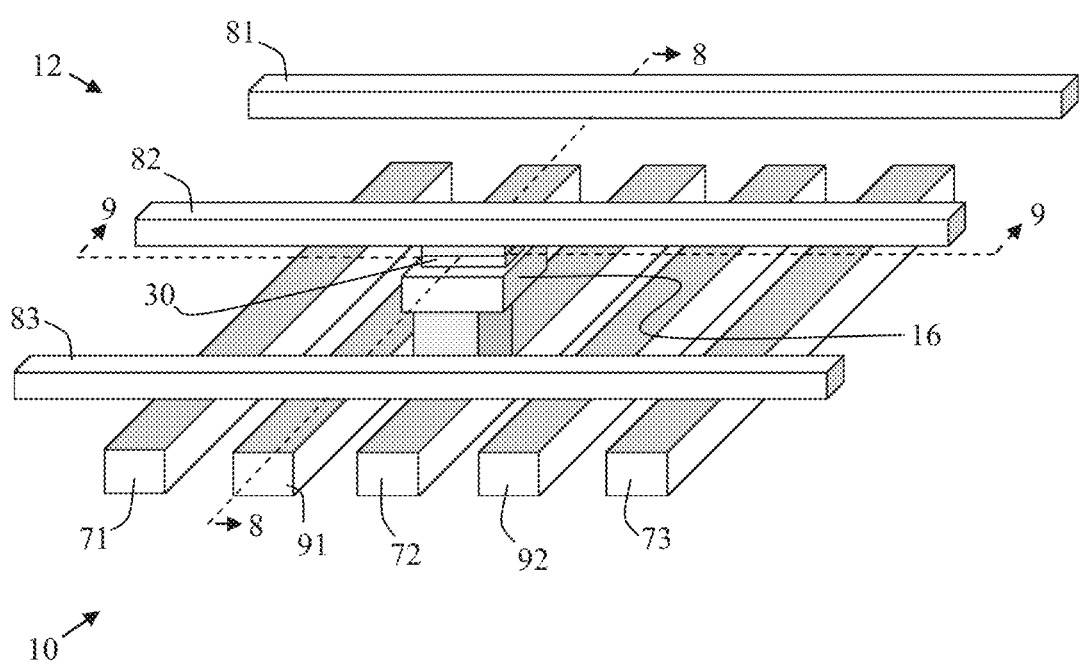
FIG. 7 is a perspective schematic view of a portion of an integrated circuit with a magnetic field assisted MRAM structure according to various embodiments herein.
Figure 8:
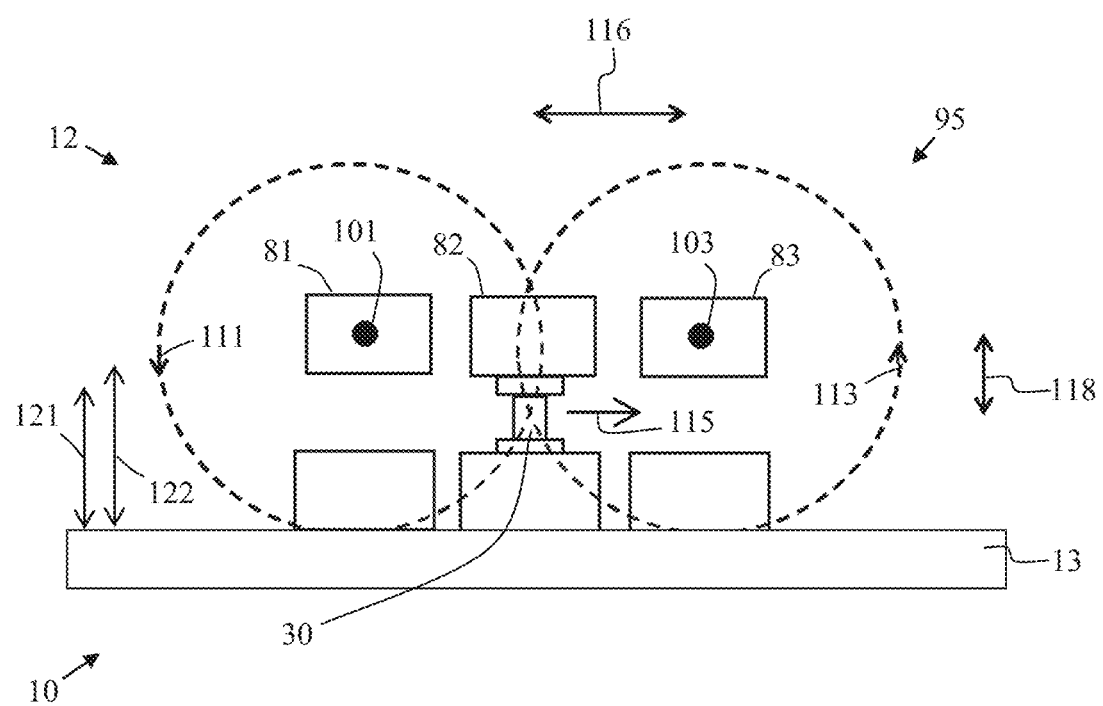
FIG. 8 is a cross sectional schematic view of the portion of the integrated circuit of FIG. 7, taken along line 8-8 in FIG. 7 in accordance with an embodiment herein.
Figure 9:
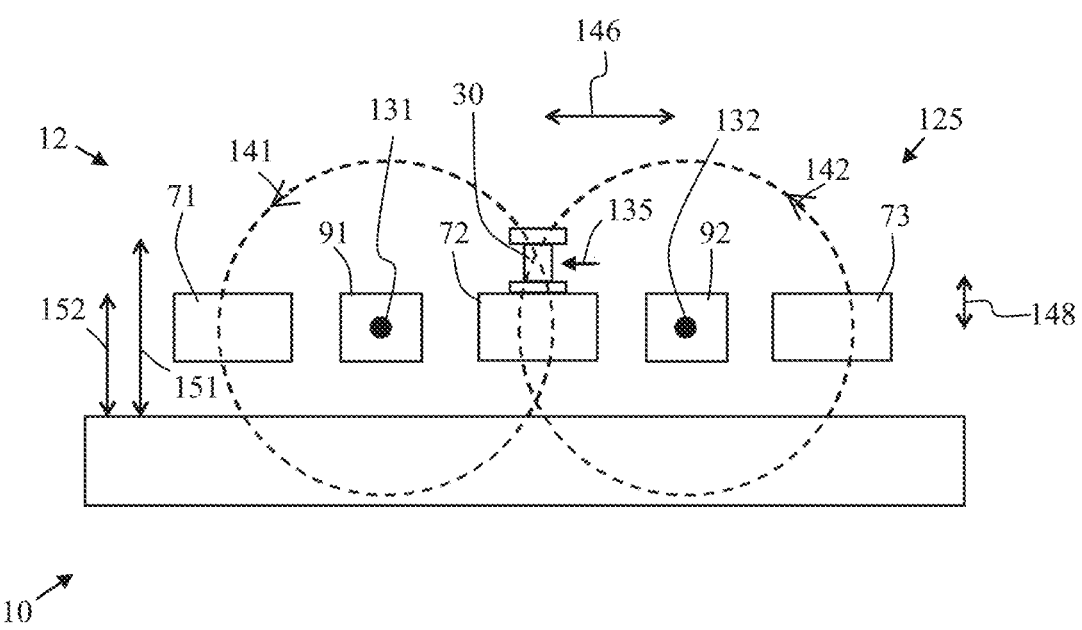
FIG. 9 is a cross sectional schematic view of the portion of the integrated circuit of FIG. 7, taken along line 9-9 in FIG. 7 in accordance with an embodiment herein.

Referring now to FIGS. 7, 8 and 9, alternative arrangements of a second embodiment of an integrated circuit device 10 with a magnetic field assisted MRAM structure 12 is described. The second embodiment provides for selectively generating a selected net magnetic field on the MRAM structure 12.

In FIG. 7, a MTJ stack 30, such as the MTJ stack 30 formed according to processing of FIGS. 1-6 (without magnetic field assist structure 40) is shown in schematic form with non-essential or non-relevant structures removed. As shown, the MTJ stack 30 lies over a word line 72 and under a bit line 82. The MTJ stack 30 is electrically coupled to the word line 72 and bit line 82 as in conventional memory processing. As further shown, word line 72 is located between adjacent lines 71 and 73 and bit line 82 is located between adjacent bit lines 81 and 83. In certain embodiments, lines 71 and 73 are adjacent word lines. It is noted that additional MTJ stacks may be located at the intersection of each line 71, 72, and 73 with each bit line 81, 82, and 83 as is common in memory arrays. In certain embodiments, additional conductive lines 91 and 92 are provided between word line 72 and line 71 and line 73, respectively. While in FIG. 7, the conductive lines 91 and 92 are depicted as being in the same level as word line 72, other arrangements are possible. For example, conductive lines 91 and 92 may be formed at the same level as metallization layer 16.

In the embodiment of FIG. 7, a current or currents may be selectively passed through the neighboring bit lines 81 and 83 or the neighboring conductive lines 91 and 92 to generate a selected net magnetic field on the MRAM structure from the bit lines 81 and 83 or conductive lines 91 and 92. During a write operation, a current may be applied to the MTJ stack 30 through word line 72 and bit line 82. Each neighboring conductive line, whether bit lines 81 and 83 or conductive lines 91 and 92, is electrically isolated from the MTJ stack 30 of the MRAM structure 12.

Referring to FIG. 8, the application of a current through bit lines 81 and 83 of FIG. 7 is schematically illustrated. As shown, a magnetic field assist structure 95 includes the pair of neighboring conductive lines (bit lines) 81 and 83 electrically isolated from the MTJ stack 30 of MRAM structure 12. Further, a current or currents 101 and 103 are applied to the conductive lines 81 and 83. While currents 101 and 103 are indicated as being applied in a same direction, currents 101 and 103 may be applied in opposite directions but still flow in the same direction. In FIG. 8, lines 81 and 83, and the currents 101 and 103 being conveyed therein are parallel. In FIG. 8, an equal amount of current is applied to lines 81 and 83; however, in certain embodiments differing amounts of current may be applied.

Due to the currents 101 and 103, magnetic fields 111 and 113 are generated around lines 81 and 83, respectively. As a result, a selected net magnetic field having a moment direction indicated by arrow 105 is applied to the MTJ structure 30 of the MRAM structure 12. As may be understood by those of ordinary skill in the art, the net magnetic field may be manipulated by the selection of the amount of current applied to lines 81 and 83, the material properties of the lines 81 and 83, and the horizontal distance 116 and vertical distance 118 from each line 81 and 83 to the MTJ stack 30.

In FIG. 8, the MTJ structure 30 of the MRAM structure 12 is formed and terminates at a maximum height 121 over substrate 13. Further, each line 81 and 83 is formed at a height 122 over the substrate 13 that is greater than height 121. While lines 81 and 83 are illustrated as being formed at a same height 122, it is possible that lines 81 and 83 be formed at different heights.

Referring to FIG. 9, the application of a current through lines 91 and 92 of FIG. 7 is schematically illustrated. As shown, a magnetic field assist structure 125 includes the pair of neighboring conductive lines 91 and 92 electrically isolated from the MTJ stack 30 of MRAM structure 12. Further, a current or currents 131 and 132 are applied to the conductive lines 91 and 92. While currents 131 and 132 are indicated as being applied in a same direction, currents 131 and 132 may be applied in opposite directions but still flow in the same direction. In FIG. 9, lines 91 and 92, and the currents 131 and 132 being conveyed therein are parallel. In FIG. 9, an equal amount of current is applied to lines 91 and 92; however, in certain embodiments differing amounts of current may be applied.

Due to the currents 131 and 132, magnetic fields 141 and 142 are generated around lines 91 and 92, respectively. As a result, a selected net magnetic field having a moment direction indicated by arrow 135 is applied to the MTJ structure 30 of the MRAM structure 12. As may be understood by those of ordinary skill in the art, the net magnetic field may be manipulated by the selection of the amount of current applied to lines 91 and 92, the material properties of the lines 91 and 92, and the horizontal distance 146 and vertical distance 148 from each line 91 and 92 to the MTJ stack 30.

In FIG. 9, the MTJ structure 30 of the MRAM structure 12 is formed and terminates at a maximum height 151 over substrate 13. Further, each line 91 and 92 is formed at a height 152 over the substrate 13 that is less than height 151. While lines 91 and 92 are illustrated as being formed at a same height 152, it is possible that lines 91 and 92 be formed at different heights.

Additional processes may be performed to complete forming the integrated circuit device 10 of FIG. 6 or 7-9. Further, the present disclosure may be embodied in other specific forms without departing from the spirit or essential characteristics thereof.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit device comprising:
    a magnetoresistive random access memory (MRAM) structure, the MRAM structure including a top electrode with an upper surface, a first sidewall, and a second sidewall opposite to the first sidewall;
    a conductive contact coupled directly to the upper surface of the top electrode;
    a first capping layer directly on the first sidewall of the MRAM structure;
    a second capping layer directly on the second sidewall of the MRAM structure; and
    a magnetic structure to generate a selected net magnetic field on the MRAM structure, the magnetic structure including a first structure segment adjacent to the first sidewall and a second structure segment adjacent to the second sidewall, the first structure segment directly on the first capping layer, and the second structure segment directly on the second capping layer.

2. The integrated circuit device of claim 1 wherein the magnetic structure is a permanent magnetic material.

3. The integrated circuit device of claim 1 wherein the magnetic structure comprises a permanent magnetic material or a ferrite material.

4. The integrated circuit device of claim 1 wherein the magnetic structure comprises a layer of cobalt platinum (CoPt), cobalt chromium platinum (CoCrPt), cobalt chromium tantalum (CoCrTa), and/or cobalt chromium tantalum platinum (CoCrTaPt).

5. The integrated circuit device of claim 4 wherein the layer has a thickness in a range of about 5 nm to about 20 nm.

6. The integrated circuit device of claim 1 wherein the magnetic structure is formed from uniaxial anisotropic material.

7. A magnetoresistive random access memory (MRAM) structure comprising:
    a magnetic tunnel junction stack having a first sidewall and a second sidewall opposite to the first sidewall, and the magnetic tunnel junction stack including a magnetic pinned layer, a magnetic free layer, and a barrier layer disposed between the magnetic pinned layer and the magnetic free layer; and
    a first capping layer directly on the first sidewall;
    a second passivation capping layer directly on the second sidewall;
    a conductive contact directly coupled to an upper surface of the magnetic tunnel junction stack;
    a magnetic structure to generate a selected net magnetic field on the magnetic free layer, the magnetic structure including a first segment directly on the first capping layer and a second segment directly on the second capping layer; and
    a dielectric layer overlying the magnetic structure, the first segment of the magnetic structure completely surrounded by the first capping layer, the conductive contact, and the dielectric layer, and the second segment completely surrounded by the second capping layer, the conductive contact, and the dielectric layer.

8. The MRAM structure of claim 7 wherein each segment of the magnetic structure comprises a layer of a permanent magnetic material or a ferrite material.

9. The MRAM structure of claim 7 wherein:
    the first capping layer includes a vertical portion directly on the first sidewall and a horizontal portion;
    all of the first segment lies directly over the first capping layer;
    the second capping layer includes a vertical portion directly on the second sidewall and a horizontal portion; and
    all of the second segment lies directly over the second capping layer.

10. The MRAM structure of claim 9 wherein:
    the first segment of the magnetic structure terminates at an upper end in direct contact with the conductive contact;
    the first segment of the magnetic structure terminates at a lower end in direct contact with the dielectric layer;
    the second segment of the magnetic structure terminates at an upper end in direct contact with the conductive contact; and
    the second segment of the magnetic structure terminates at a lower end in direct contact with the dielectric layer.

11. The MRAM structure of claim 9 wherein the magnetic structure is formed from uniaxial anisotropic material.

12. The MRAM structure of claim 7 wherein the magnetic structure is a permanent magnetic material.

13. The MRAM structure of claim 7 wherein the magnetic structure comprises a permanent magnetic material or a ferrite material.

14. The MRAM structure of claim 7 wherein the magnetic structure comprises a layer of cobalt platinum (CoPt), cobalt chromium platinum (CoCrPt), cobalt chromium tantalum (CoCrTa), and/or cobalt chromium tantalum platinum (CoCrTaPt).

15. The MRAM structure of claim 14 wherein the layer has a thickness in a range of about 5 nm to about 20 nm.

* * * * *